US012575420B2

(12) United States Patent
Fu et al.

(10) Patent No.: US 12,575,420 B2
(45) Date of Patent: Mar. 10, 2026

(54) ELECTRONIC PACKAGE AND MANUFACTURING METHOD THEREOF

(71) Applicant: SILICONWARE PRECISION INDUSTRIES CO., LTD., Taichung (TW)

(72) Inventors: Yi-Min Fu, Taichung (TW); Hung-Kai Wang, Taichung (TW); Chi-Ching Ho, Taichung (TW); Yih-Jenn Jiang, Taichung (TW); Yu-Po Wang, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 508 days.

(21) Appl. No.: 18/148,440

(22) Filed: Dec. 30, 2022

(65) Prior Publication Data

US 2024/0153884 A1     May 9, 2024

(30) Foreign Application Priority Data

Nov. 3, 2022    (TW) .................................. 111142048

(51) Int. Cl.
| | |
|---|---|
| *H01L 23/04* | (2006.01) |
| *H01L 23/00* | (2006.01) |
| *H01L 23/31* | (2006.01) |
| *H01L 23/498* | (2006.01) |
| *H01L 23/552* | (2006.01) |

(52) U.S. Cl.
CPC ........ *H01L 23/552* (2013.01); *H01L 23/3128* (2013.01); *H01L 23/49816* (2013.01); *H01L 24/16* (2013.01); *H01L 24/73* (2013.01); *H01L 2224/04105* (2013.01); *H01L 2224/12105* (2013.01); *H01L 2224/48091* (2013.01); *H01L 2924/15311* (2013.01); *H01L 2924/181* (2013.01)

(58) Field of Classification Search
None
See application file for complete search history.

(56) References Cited

U.S. PATENT DOCUMENTS

| | | | |
|---|---|---|---|
| 9,773,757 B2 * | 9/2017 | Yu | H01L 24/19 |
| 2019/0057911 A1 * | 2/2019 | Chen | H01L 22/14 |

* cited by examiner

*Primary Examiner* — Long Pham
(74) *Attorney, Agent, or Firm* — Studebaker Brackett PLLC

(57) ABSTRACT

An electronic package is provided, in which a first electronic element and a second electronic element stacked on each other are embedded in a cladding layer, a circuit structure electrically connected to the second electronic element is formed on the cladding layer, and a passive element and a package module are disposed on the circuit structure, so as to shorten the transmission distance of electrical signals between the package module and the second electronic element.

9 Claims, 6 Drawing Sheets

ELECTRONIC PACKAGE AND MANUFACTURING METHOD THEREOF

BACKGROUND

1. Technical Field

The present disclosure relates to a semiconductor device, and more particularly, to an electronic package with a stack structure of electronic elements and a manufacturing method thereof.

2. Description of Related Art

With the vigorous development of the electronic industry, electronic products are also gradually moving towards the trend of multi-function and high performance. Technologies currently used in the field of chip packaging include, for example, flip-chip package modules such as chip scale package (CSP), direct chip attached (DCA), or multi-chip module (MCM) and the like.

FIG. 1 is a schematic cross-sectional view of a conventional semiconductor package 1. As shown in FIG. 1, in the semiconductor package 1, a semiconductor chip 11 and a plurality of conductive pillars 13 are embedded in a cladding layer 15, and a circuit structure 16 electrically connected to the plurality of conductive pillars 13 is formed on the upper side of the cladding layer 15. A routing structure 10 (e.g., a wiring structure) electrically connected to the semiconductor chip 11 and the plurality of conductive pillars 13 is formed on the lower side of the cladding layer 15, wherein the semiconductor chip 11 is electrically connected to the routing structure 10 via a plurality of conductive bumps 111, and the surface of the semiconductor chip 11 has an insulating protection layer 112, so that the conductive bumps 111 protrude from the insulating protection layer 112.

In the conventional semiconductor package 1, a memory module 12 can be disposed on the circuit structure 16 via solder bumps 17, so that the memory module 12 is electrically connected to the circuit structure 16, wherein a passive element 14 can be arranged on the routing structure 10 corresponding to the cladding layer 15, so that the passive element 14 is electrically connected to the routing structure 10, and a plurality of solder balls 19 are formed on the lower side of the routing structure 10 for the semiconductor package 1 to be mounted on a circuit board (not shown).

However, in the conventional semiconductor package 1, the memory module 12 and the semiconductor chip 11 are electrically connected to the circuit structure 16 and the routing structure 10 respectively, so that electrical signals between the memory module 12 and the semiconductor chip 11 need to be transmitted via the circuit structure 16, the conductive pillars 13 and the routing structure 10. As a result, the transmission distance of the electrical signals between the memory module 12 and the semiconductor chip 11 is too long, thereby reducing the electrical transmission rate between the memory module 12 and the semiconductor chip 11 and increasing the transmission delay time between the memory module 12 and the semiconductor chip 11, resulting in that it is difficult to improve the electrical performance of the conventional semiconductor package 1, and thus the conventional semiconductor package 1 cannot meet the performance requirements of the end product.

Furthermore, only a single active element, that is, the semiconductor chip 11, is embedded in the cladding layer 15, so the performance cannot be improved. Moreover, if another electronic element, such as another semiconductor chip or passive element 14 is arranged on the routing structure 10 in the cladding layer 15, the layout area of the routing structure 10 needs to be increased, resulting in the increase of the overall volume of the semiconductor package 1, so that the end product cannot meet the requirements of being light, thin, and short.

Furthermore, the semiconductor chip 11 and the passive element 14 are integrated on the routing structure 10 in a side-by-side manner, so that the semiconductor chip 11 and the passive element 14 need to transmit signals therebetween in a lateral (as shown in FIG. 1, arrow directions X) electrical transmission manner, resulting in an excessively long transmission distance. As a result, the electrical performance is poor and cannot meet the performance requirements of the end product.

Therefore, how to overcome the above-mentioned various problems of the prior art has become an urgent problem to be solved at present.

SUMMARY

In view of the various deficiencies of the prior art, the present disclosure provides an electronic package, comprising: a cladding layer having a first surface and a second surface opposing the first surface; a first electronic element embedded in the cladding layer corresponding to the first surface of the cladding layer; a second electronic element stacked on the first electronic element and embedded in the cladding layer corresponding to the second surface of the cladding layer; a circuit structure formed on the second surface of the cladding layer and electrically connected to the second electronic element; a passive element disposed on the circuit structure and corresponding to a position of the second electronic element, wherein the passive element is electrically connected to the second electronic element via the circuit structure; and a package module stacked on and electrically connected to the circuit structure.

The present disclosure also provides a method of manufacturing an electronic package, comprising: providing a first electronic element having an active surface and an inactive surface opposing the active surface, wherein the active surface is attached with a bonding layer; disposing the first electronic element on a carrier with the bonding layer; stacking a second electronic element on the first electronic element; forming a cladding layer on the carrier, wherein the first electronic element and the second electronic element are covered by the cladding layer, wherein the cladding layer is defined with a first surface and a second surface opposing the first surface, and the first surface is bonded to the carrier; forming a circuit structure on the second surface of the cladding layer, wherein the circuit structure is electrically connected to the second electronic element; removing the carrier to expose the first surface of the cladding layer and the bonding layer on the active surface of the first electronic element; removing the bonding layer; disposing a passive element on the circuit structure, wherein the passive element corresponds to a position of the second electronic element, and the passive element is electrically connected to the second electronic element via the circuit structure; and stacking a package module on the circuit structure, wherein the package module is electrically connected to the circuit structure.

In the aforementioned electronic package and method, the first electronic element has first conductors and a first insulating layer covering the first conductors, and the bonding layer is attached on the first insulating layer, wherein part of a material of the first conductors, part of a material of the first insulating layer and part of a material of the cladding layer are removed when the bonding layer is removed, and outer surfaces of the first conductors are flush with the first surface of the cladding layer.

In the aforementioned electronic package and method, the second electronic element has second conductors, wherein a leveling process is performed when the cladding layer is formed, such that outer surfaces of the second conductors are flush with the second surface of the cladding layer, and then the circuit structure is formed on the second surface of the cladding layer.

In the aforementioned electronic package and method, the passive element is located between the circuit structure and the package module.

In the aforementioned electronic package and method, the present disclosure further comprises forming a routing structure on the first surface of the cladding layer, wherein the routing structure is electrically connected to the first electronic element. For example, the present disclosure further comprises disposing a plurality of solder materials or an electronic device on the routing structure. Further, the present disclosure may comprise forming a plurality of conductive pillars on the carrier, wherein the plurality of conductive pillars are covered by the cladding layer, and the plurality of conductive pillars are electrically connected to the routing structure and the circuit structure.

In the aforementioned electronic package and method, the present disclosure further comprises forming a plurality of conductive pillars on the carrier, wherein the plurality of conductive pillars are covered by the cladding layer, wherein the plurality of conductive pillars are electrically connected to the circuit structure after forming the circuit structure, wherein end surfaces of the conductive pillars are exposed from the first surface of the cladding layer after removing the carrier.

In the aforementioned electronic package and method, the present disclosure further comprises encapsulating the package module, the cladding layer, the circuit structure and the passive element with an encapsulation layer. The present disclosure further comprises forming a shielding layer on the encapsulation layer.

As can be seen from the above, the electronic package and the manufacturing method thereof of the present disclosure disperse thermal stress during the fabrication of the circuit structure by disposing the bonding layer on the active surface of the first electronic element, so as to avoid the problem of cracking of the first electronic element.

Furthermore, by arranging the package module and the second electronic element on opposite sides of the circuit structure respectively (or arranging the package module and the second electronic element on the side of the second surface of the cladding layer) to shorten the transmission distance of electrical signals between the package module and the second electronic element, so as to increase the electrical transmission rate between the package module and the second electronic element and reduce the transmission delay time between the package module and the second electronic element. Therefore, compared with the prior art, the electrical performance of the electronic package of the present disclosure can be improved, thereby meeting the performance requirements of the end product.

Furthermore, by embedding the first electronic element and the second electronic element in the cladding layer, the performance is improved, and by vertically stacking the first electronic element and the second electronic element, the overall volume of the electronic package can be effectively reduced. Therefore, compared with the prior art, the electronic package of the present disclosure can not only provide more functions, but also can be reduced in size.

In addition, with the position of the second electronic element and the position of the passive element overlapping each other in the vertical direction, and with the circuit structure being used as an electrical connection path between the second electronic element and the passive element, the transmission distance of the electrical signals between the second electronic element and the passive element can be shortened. Therefore, the electronic package of the present disclosure can improve the electrical performance via the fast and low-loss vertical circuit conduction path, and thus can meet the performance requirements of the end product.

DETAILED DESCRIPTIONS

The following describes the implementation of the present disclosure with examples. Those skilled in the art can easily understand other advantages and effects of the present disclosure from the contents disclosed in this specification.

It should be understood that, the structures, ratios, sizes, and the like in the accompanying figures are used for illustrative purposes to facilitate the perusal and comprehension of the contents disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical contents disclosed in the present specification. Meanwhile, terms such as "upper," "on," "first," "second," "a," "one" and the like used herein are merely used for clear explanation rather than limiting the practicable scope of the present disclosure, and thus, alterations or adjustments of the relative relationships thereof without essentially altering the technical contents should still be considered in the practicable scope of the present disclosure.

FIG. 2A to FIG. 2H are schematic cross-sectional views illustrating a method of manufacturing an electronic package 2 according to the present disclosure.

Figure 1:
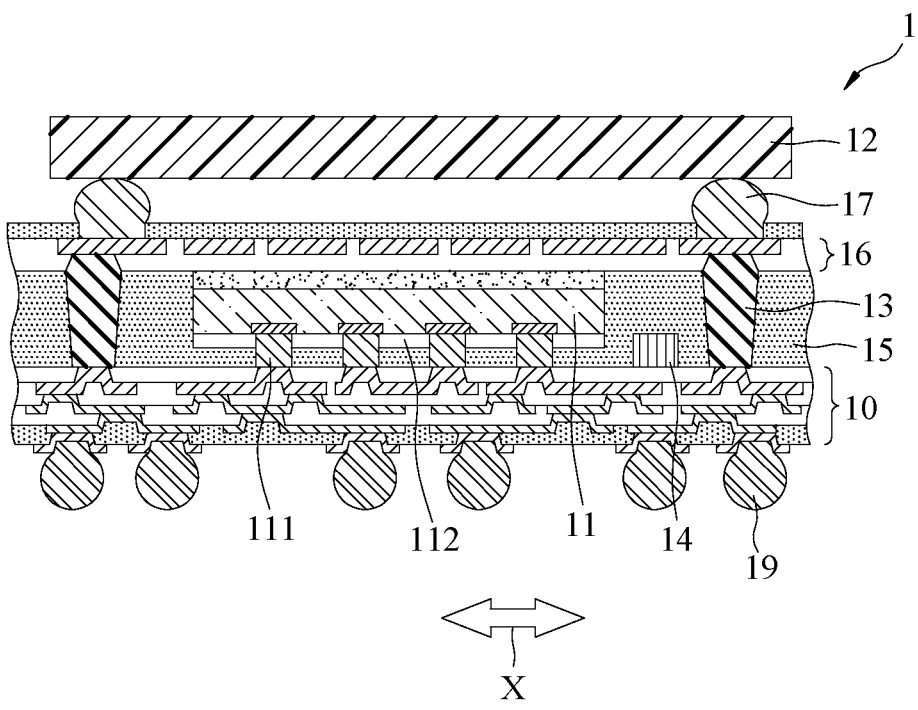
FIG. 1 is a schematic cross-sectional view of a conventional semiconductor package.
Figure 2A:
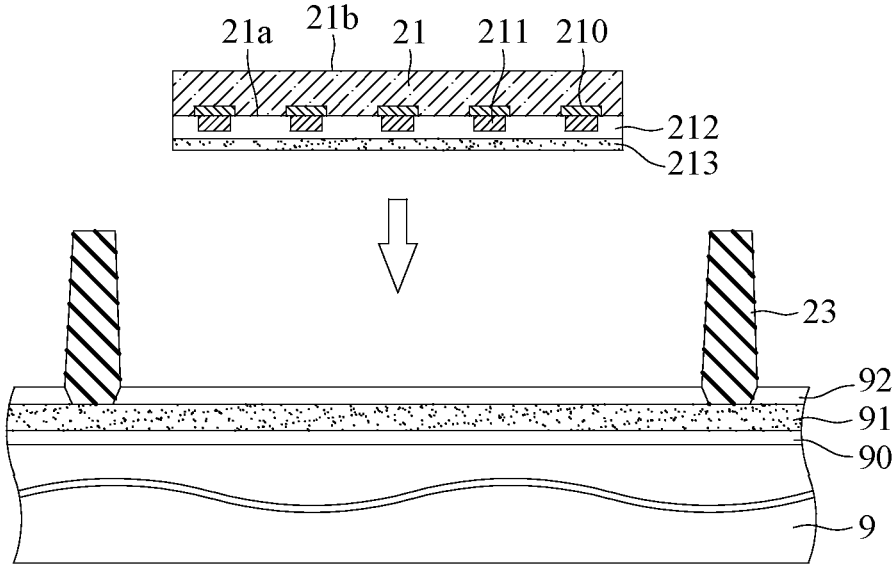
FIG. 2A to FIG. 2H are schematic cross-sectional views illustrating a method of manufacturing an electronic package according to the present disclosure.

As shown in FIG. 2A, a carrier 9 and a first electronic element 21 are provided, and a plurality of conductive pillars 23 are formed on the carrier 9.

In an embodiment, the carrier 9 is a circular board body made of semiconductor material such as glass, on which a release layer 90 and a bonding layer 91 are sequentially formed by coating. Further, an insulating layer 92 is formed on the bonding layer 91.

Furthermore, the first electronic element 21 is a semiconductor element which is an active element, a passive element, or a combination of the active element and the passive element. The active element is such as a semiconductor chip, and the passive element is such as a resistor, a capacitor, or an inductor. For example, the first electronic element 21 is a semiconductor chip, such as a microcontroller unit (MCU)

or an application specific integrated circuit (ASIC). The first electronic element 21 has a first active surface 21a and a first inactive surface 21b opposing the first active surface 21a, wherein the first active surface 21a has a plurality of first electrode pads 210 for disposing first conductors 211 such as copper bumps and/or solder bumps, and a first insulating layer 212 is formed on the first active surface 21a to cover the first conductors 211. Further, a first bonding layer 213 such as a die attach film (DAF) is attached on the first insulating layer 212.

In addition, the conductive pillars 23 are disposed on the insulating layer 92 of the carrier 9, and the material for forming the conductive pillars 23 is a metal material such as copper or a solder material.

Figure 2B:
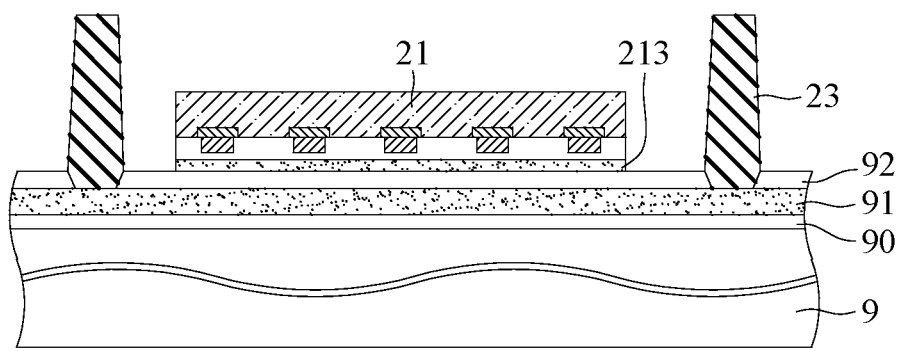
Figure 2C:
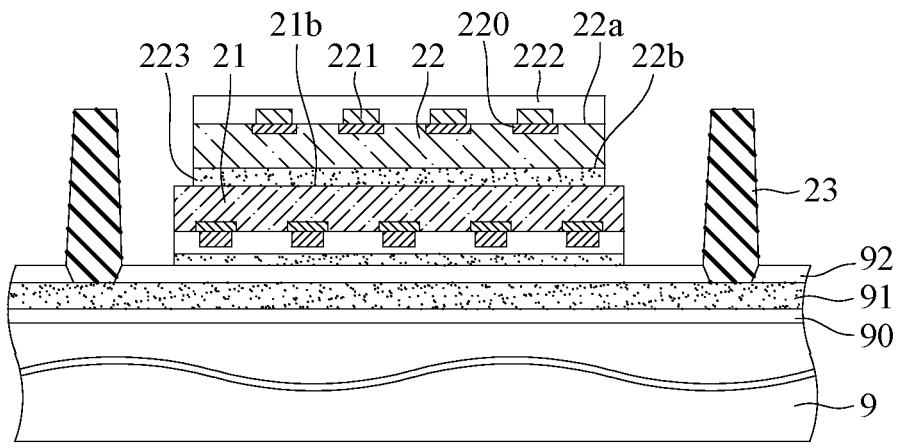

As shown in FIG. 2B to FIG. 2C, the first electronic element 21 is first bonded onto the insulating layer 92 of the carrier 9 with the first bonding layer 213, and then a second electronic element 22 is bonded onto the first electronic element 21.

In an embodiment, the second electronic element 22 is an active element, a passive element, or a combination of the active element and the passive element. The active element is such as a semiconductor chip, and the passive element is such as a resistor, a capacitor, or an inductor. For example, the second electronic element 22 is a semiconductor chip, such as a microcontroller (MCU) or an application specific integrated circuit (ASIC). The second electronic element 22 has a second active surface 22a and a second inactive surface 22b opposing the second active surface 22a, wherein the second active surface 22a is provided with a plurality of second electrode pads 220 and a second insulating layer 222, and second conductors 221 such as copper pillars and/or solder bumps are formed on the second electrode pads 220, so that the second insulating layer 222 covers the second electrode pads 220 and the second conductors 221.

Furthermore, the second electronic element 22 is adhered onto the first inactive surface 21b of the first electronic element 21 with its second inactive surface 22b by a second bonding layer 223 such as adhesive. For example, the second bonding layer 223 is formed on the lower side of the second electronic element 22 first, and then the second electronic element 22 is adhered onto the first electronic element 21. It should be understood that the second bonding layer 223 can also be formed on the first electronic element 21 first, and then the second electronic element 22 is adhered onto the second bonding layer 223.

Figure 2D:
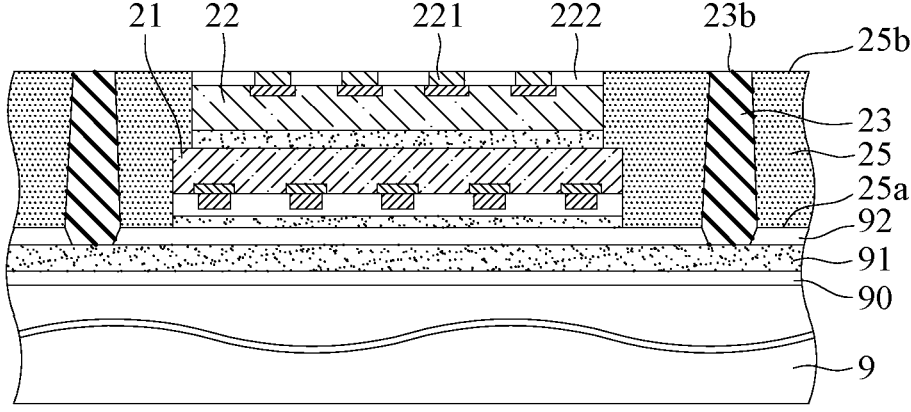

As shown in FIG. 2D, a cladding layer 25 is formed on the carrier 9, so that the cladding layer 25 covers the first electronic element 21, the second electronic element 22 and the conductive pillars 23. Then, end surfaces 23b of the conductive pillars 23 and outer surfaces of the second conductors 221 of the second electronic element 22 are exposed from the cladding layer 25 via a leveling process.

In an embodiment, the cladding layer 25 is defined with a first surface 25a and a second surface 25b opposing the first surface 25a, so that the cladding layer 25 is bonded onto the insulating layer 92 with its first surface 25a.

Furthermore, the cladding layer 25 is an insulating material, such as polyimide (PI), dry film, epoxy resin, molding compound, or other packaging material, and the cladding layer 25 can be formed on the carrier 9 by lamination or molding.

In addition, by grinding, the leveling process removes part of the material of the conductive pillars 23, part of the material of the second insulating layer 222 (part of the material of the second conductors 221 can be removed according to requirements) and part of the material of the second surface 25b of the cladding layer 25. For example, the end surfaces 23b of the conductive pillars 23, the outer surface of the second insulating layer 222 and the outer surfaces of the second conductors 221 are flush with second surface 25b of the cladding layer 25.

Figure 2E:
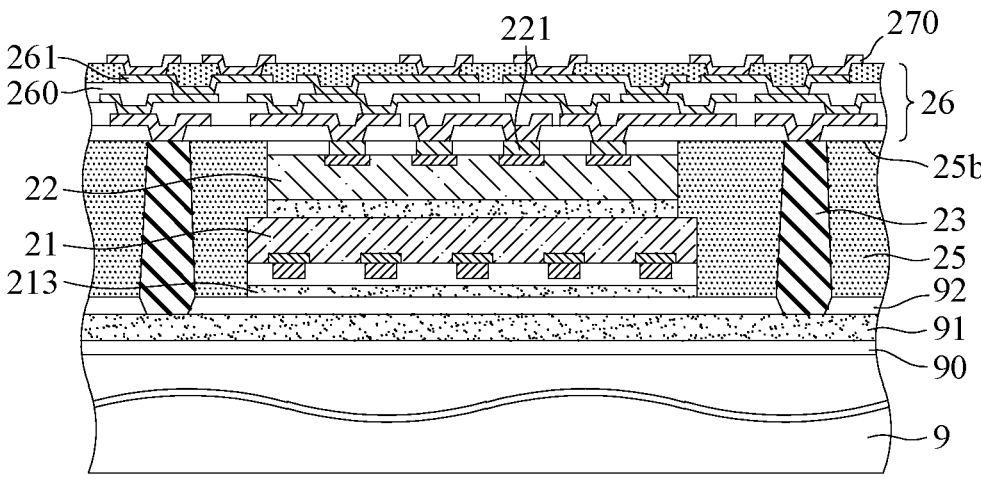

As shown in FIG. 2E, a circuit structure 26 is formed on the second surface 25b of the cladding layer 25, and the circuit structure 26 is electrically connected with the conductive pillars 23 and the plurality of second conductors 221 of the second electronic element 22.

In an embodiment, the circuit structure 26 includes a plurality of dielectric layers 260 and a plurality of circuit layers 261 disposed on the plurality of dielectric layers 260, wherein the plurality of circuit layers 261 are for example of a redistribution layer (RDL) specification, and the outermost dielectric layer 260 can be used as a solder mask layer, so that the outermost circuit layer 261 is exposed from the solder mask layer. Alternatively, the circuit structure 26 may only include a single dielectric layer 260 and a single circuit layer 261.

Furthermore, the material for forming the circuit layer 261 is copper, and the material for forming the dielectric layer 260 is such as polybenzoxazole (PBO), polyimide (PI), prepreg (PP), or other dielectric materials.

In addition, an under bump metallurgy (UBM) layer 270 may be formed on the outermost circuit layer 261 of the circuit structure 26 to facilitate the bonding of conductive elements 27.

Figure 2F:
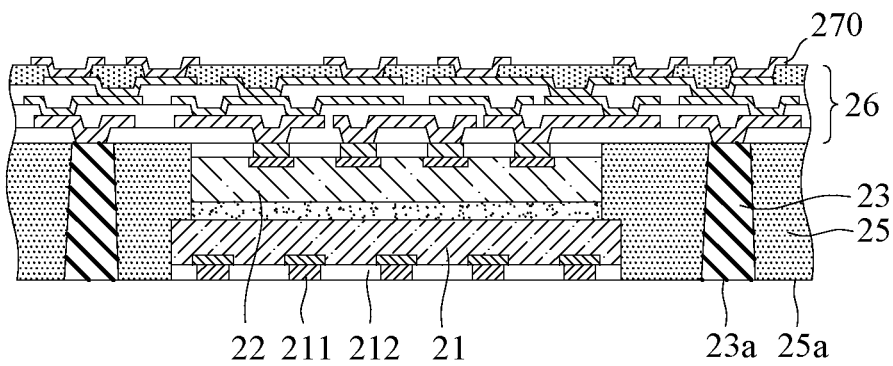

As shown in FIG. 2F, the carrier 9 and the release layer 90 and the bonding layer 91 thereon are removed. Next, a leveling process is performed to remove the insulating layer 92 and part of the material of the conductive pillars 23, and the first bonding layer 213 is removed together, so that the outer surface of the first insulating layer 212 of the first electronic element 21, the outer surfaces of the first conductors 211 and the end surfaces 23a of the conductive pillars 23 are exposed from the first surface 25a of the cladding layer 25.

In an embodiment, by grinding, the leveling process removes part of the material of the conductive pillars 23, the first bonding layer 213 and part of the material of the first surface 25a of the cladding layer 25, and even part of the material of the first insulating layer 212 and part of the material of the first conductors 211 can be removed. For example, the end surfaces 23a of the conductive pillars 23, the outer surface of the first insulating layer 212 and the outer surfaces of the first conductors 211 are flush with the first surface 25a of the cladding layer 25.

Figure 2G:
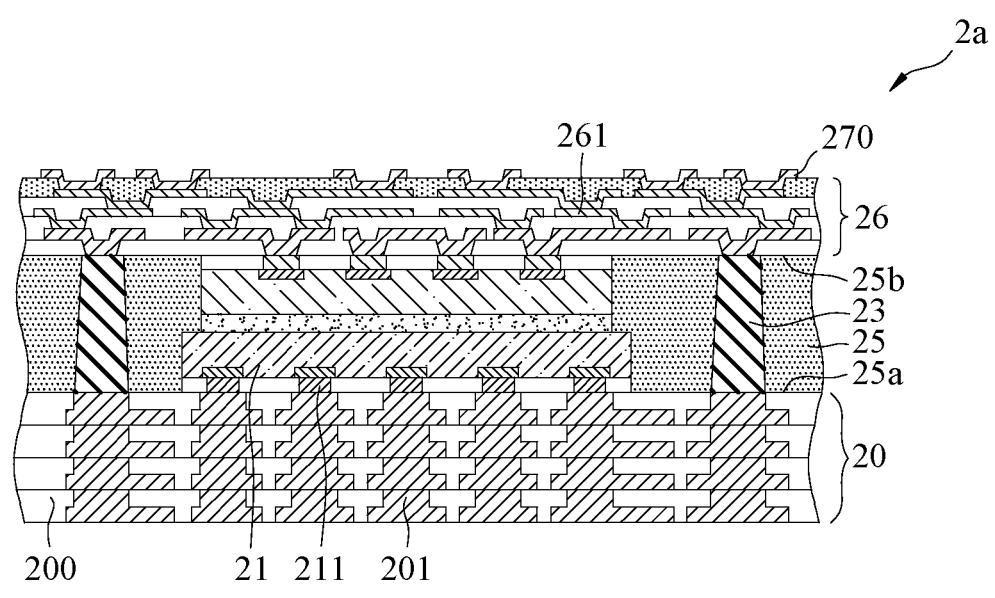

As shown in FIG. 2G, a routing structure 20 (e.g., a wiring structure) is formed on the first surface 25a of the cladding layer 25, and the routing structure 20 is electrically connected with the conductive pillars 23 and the plurality of first conductors 211 of the first electronic element 21 to form an electronic module 2a.

In an embodiment, the routing structure 20 includes at least one dielectric layer 200, and a routing layer 201 (e.g., a wiring layer) disposed on the at least one dielectric layer 200, wherein the routing layer 201 is for example of a redistribution layer (RDL) specification. For example, the material for forming the routing layer 201 is copper, and the material for forming the dielectric layer 200 is such as polybenzoxazole (PBO), polyimide (PI), prepreg (PP), or other dielectric materials.

Figure 2H:
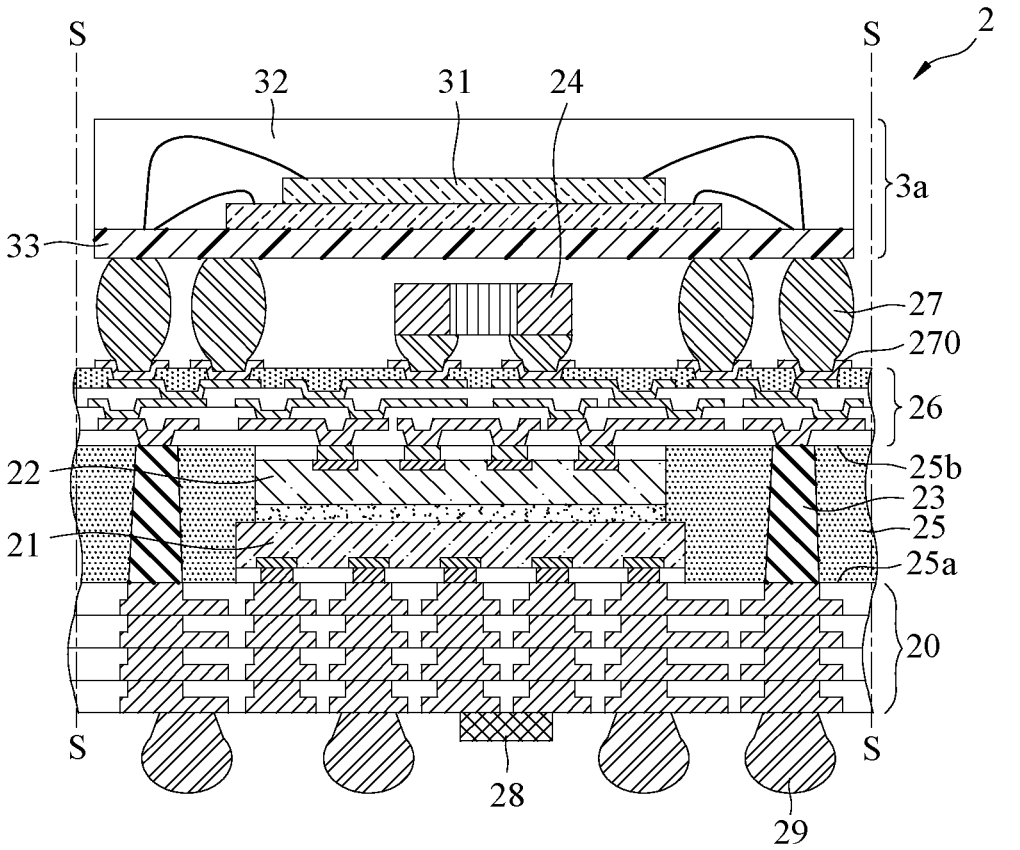

As shown in FIG. 2H, a plurality of solder materials 29 such as solder balls are formed on the routing structure 20, and at least one passive element 24 is disposed on the circuit structure 26, wherein a package module 3a is stacked on the circuit structure 26 via the plurality of conductive elements 27 such as solder bumps to form the electronic package 2 of the present disclosure.

In an embodiment, the passive element 24 is located between the circuit structure 26 (the electronic module 2a) and the package module 3a, and the package module 3a is a package structure or another package. For example, the package module 3a is a dynamic random access memory (DRAM) and includes at least one semiconductor chip 31 and a packaging material 32 covering the semiconductor chip 31, wherein the semiconductor chip 31 can even be carried by a package substrate 33. It should be understood that there are various types of the package module 3a, and the present disclosure is not limited to as such.

Furthermore, at least one electronic device 28 such as a capacitor, an inductor, or a resistor can be arranged on the routing structure 20 according to requirements.

Figure 3:
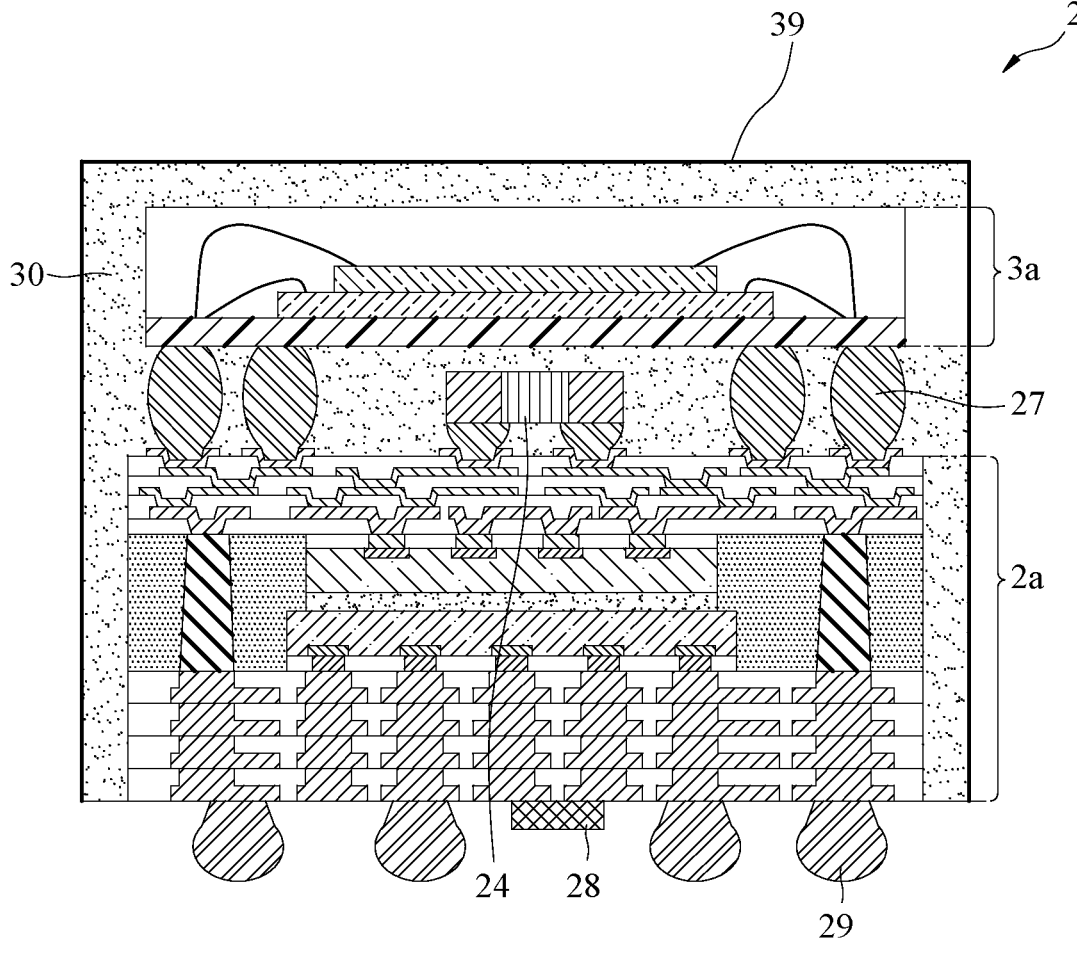
FIG. 3 is a schematic cross-sectional view of the subsequent process of FIG. 2H.

In the subsequent process, as shown in FIG. 3, a singulation process is first performed along a cutting path S shown in FIG. 2H to obtain a plurality of electronic modules 2a stacked with the package module 3a, and then the package module 3a and the electronic module 2a are encapsulated with an encapsulation layer 30, so that the electronic package 2 is mounted on a circuit board (not shown) by the solder materials 29. For example, the encapsulation layer 30 is an insulating material such as polyimide (PI), dry film, epoxy resin, molding compound, or other encapsulating materials.

Further, a shielding layer 39 may be formed on the encapsulation layer 30 to prevent the package module 3a and the electronic module 2a from being subjected to electromagnetic interference (EMI). For example, the shielding layer 39 such as a metal layer can be fabricated by sputtering, vapor deposition, electroplating, electroless plating, or film sticking, but not limited to the above-mentioned methods.

Therefore, in the manufacturing method of the electronic package 2 of the present disclosure, disposing the first bonding layer 213 on the first active surface 21a of the first electronic element 21 can not only protect the first conductors 211, but also can disperse thermal stress while performing multiple thermal processes of RDL, so as to avoid the problem of tip crack in the first conductors 211. For example, if there is no first bonding layer 213 on the first active surface 21a of the first electronic element 21, each of the first conductors 211 and its surroundings are easily broken due to an intermetallic compound (IMC).

Furthermore, by disposing the package module 3a (DRAM) on the circuit structure 26, the package module 3a (DRAM) can transmit electrical signals with the second electronic element 22 via the circuit structure 26, so that the transmission distance of electrical signals between the package module 3a (DRAM) and the second electronic element 22 is greatly shortened, so as to improve the electrical transmission rate between the package module 3a (DRAM) and the second electronic element 22, and reduce the transmission delay time between the package module 3a (DRAM) and the second electronic element 22. Therefore, compared with the prior art, the electrical performance of the electronic package 2 of the present disclosure can be improved to meet the performance requirements of the end product.

Furthermore, by adding a plurality of chips (i.e., the first electronic element 21 and the second electronic element 22) in the cladding layer 25, the electronic module 2a has chips with various functions, so as to improve the performance, and by vertically stacking the first electronic element 21 and the second electronic element 22 in a back-to-back manner (i.e., the first inactive surface 21b is bonded to the second inactive surface 22b), the overall volume of the electronic package 2 can be effectively reduced. Therefore, compared with the prior art, the electronic package 2 of the present disclosure can not only provide more functions, but also can be reduced in size.

In addition, with the position of the second electronic element 22 and the position of the passive element 24 overlapping each other in the vertical direction, and with the circuit structure 26 being used as an electrical connection path between the second electronic element 22 and the passive element 24, the transmission distance of the electrical signals between the second electronic element 22 and the passive element 24 can be shortened. Similarly, with the position of the first electronic element 21 and the position of the electronic device 28 overlapping each other in the vertical direction, and with the routing structure 20 being used as an electrical connection path between the first electronic element 21 and the electronic device 28, the transmission distance of the electrical signals between the first electronic element 21 and the electronic device 28 can be shortened. Therefore, the electronic package 2 of the present disclosure can improve the electrical performance via the fast and low-loss vertical circuit conduction path, and thus can meet the performance requirements of the end product.

The present disclosure also provides an electronic package 2, which includes: a cladding layer 25, a first electronic element 21, a second electronic element 22, a circuit structure 26, a passive element 24, and a package module 3a.

The cladding layer 25 has a first surface 25a and a second surface 25b opposing the first surface 25a.

The first electronic element 21 is embedded in the cladding layer 25 corresponding to the first surface 25a of the cladding layer 25.

The second electronic element 22 is stacked on the first electronic element 21 and is embedded in the cladding layer 25 corresponding to the second surface 25b of the cladding layer 25.

The circuit structure 26 is formed on the second surface 25b of the cladding layer 25 and is electrically connected to the second electronic element 22.

The passive element 24 is disposed on the circuit structure 26 and corresponds to the position of the second electronic element 22, so as to be electrically connected to the second electronic element 22 via the circuit structure 26.

The package module 3a is stacked on the circuit structure 26 and is electrically connected to the circuit structure 26.

In one embodiment, the first electronic element 21 has first conductors 211, so that the outer surfaces of the first conductors 211 are flush with the first surface 25a of the cladding layer 25.

In one embodiment, the second electronic element 22 has second conductors 221, so that the outer surfaces of the second conductors 221 are flush with the second surface 25b of the cladding layer 25.

In one embodiment, the passive element 24 is located between the circuit structure 26 and the package module 3a.

In one embodiment, the electronic package 2 further includes a routing structure 20 formed on the first surface 25a of the cladding layer 25, wherein the routing structure 20 is electrically connected to the first electronic element 21. For example, a plurality of solder materials 29 or an electronic device 28 are arranged on the routing structure 20. Further, a plurality of conductive pillars 23 embedded in the cladding layer 25 may be included to electrically connect the routing structure 20 and the circuit structure 26.

In one embodiment, the electronic package 2 further includes a plurality of conductive pillars 23 embedded in the cladding layer 25, wherein the conductive pillars 23 are electrically connected to the circuit structure 26, and the conductive pillars 23 are exposed from the first surface 25a of the cladding layer 25.

In one embodiment, the electronic package 2 further includes an encapsulation layer 30 encapsulating the package module 3a, the cladding layer 25, the circuit structure 26 and the passive element 24. The electronic package 2 also includes a shielding layer 39 formed on the encapsulation layer 30.

To sum up, the electronic package and the manufacturing method thereof of the present disclosure disperse thermal stress during the fabrication of the circuit structure by disposing the first bonding layer on the active surface of the first electronic element, so as to avoid the problem of cracking of the first electronic element.

Furthermore, by arranging the package module and the second electronic element on opposite sides of the circuit structure respectively (or arranging the package module and the second electronic element on the side of the second surface of the cladding layer) to shorten the transmission distance of electrical signals between the package module and the second electronic element, so as to increase the electrical transmission rate between the package module and the second electronic element and reduce the transmission delay time between the package module and the second electronic element. Therefore, the electrical performance of the electronic package of the present disclosure can be improved, thereby meeting the performance requirements of the end product.

Furthermore, by embedding the first electronic element and the second electronic element in the cladding layer, the performance is improved, and by vertically stacking the first electronic element and the second electronic element, the overall volume of the electronic package can be effectively reduced. Therefore, the electronic package of the present disclosure can not only provide more functions, but also can be reduced in size.

In addition, with the position of the second electronic element and the position of the passive element overlapping each other in the vertical direction, and with the circuit structure being used as an electrical connection path between the second electronic element and the passive element, the transmission distance of the electrical signals between the second electronic element and the passive element can be shortened. Therefore, the electronic package of the present disclosure can improve the electrical performance via the fast and low-loss vertical circuit conduction path, and thus can meet the performance requirements of the end product.

The foregoing embodiments are provided for the purpose of illustrating the principles and effects of the present disclosure, rather than limiting the present disclosure. Anyone skilled in the art can modify and alter the above embodiments without departing from the spirit and scope of the present disclosure. Therefore, the scope of protection with regard to the present disclosure should be as defined in the accompanying claims listed below.

What is claimed is:

1. An electronic package, comprising:
   a cladding layer having a first surface and a second surface opposing the first surface;
   a first electronic element embedded in the cladding layer corresponding to the first surface of the cladding layer, wherein the first electronic element has first conductors, and outer surfaces of the first conductors are flush with the first surface of the cladding layer;
   a second electronic element stacked on the first electronic element and embedded in the cladding layer corresponding to the second surface of the cladding layer;
   a circuit structure formed on the second surface of the cladding layer and electrically connected to the second electronic element;
   a passive element disposed on the circuit structure and corresponding to a position of the second electronic element, wherein the passive element is electrically connected to the second electronic element via the circuit structure; and
   a package module stacked on and electrically connected to the circuit structure.

2. The electronic package of claim 1, wherein the second electronic element has second conductors, and outer surfaces of the second conductors are flush with the second surface of the cladding layer.

3. The electronic package of claim 1, wherein the passive element is located between the circuit structure and the package module.

4. The electronic package of claim 1, further comprising a routing structure formed on the first surface of the cladding layer, wherein the routing structure is electrically connected to the first electronic element.

5. The electronic package of claim 4, further comprising a plurality of solder materials or an electronic device disposed on the routing structure.

6. The electronic package of claim 4, further comprising a plurality of conductive pillars embedded in the cladding layer, wherein the conductive pillars are electrically connected to the routing structure and the circuit structure.

7. The electronic package of claim 1, further comprising a plurality of conductive pillars embedded in the cladding layer, wherein the conductive pillars are electrically connected to the circuit structure, and end surfaces of the conductive pillars are flush with the first surface of the cladding layer.

8. The electronic package of claim 1, further comprising an encapsulation layer encapsulating the package module, the cladding layer, the circuit structure and the passive element.

9. The electronic package of claim 8, further comprising a shielding layer formed on the encapsulation layer.

* * * * *